United States Patent [19]
Boyer

[11] Patent Number: 4,593,210
[45] Date of Patent: Jun. 3, 1986

[54] SWITCHING CIRCUIT WITH ACTIVE PULL-OFF

[75] Inventor: Richard M. Boyer, Orem, Utah

[73] Assignee: Signetics Corporation, Sunnyvale, Calif.

[21] Appl. No.: 519,440

[22] Filed: Aug. 1, 1983

[51] Int. Cl.[4] .......................................... H03K 19/013
[52] U.S. Cl. .................................. 307/443; 307/456; 307/270; 307/300
[58] Field of Search ............... 307/443, 446, 454–456, 307/544, 547, 549, 563, 300, 270

[56] References Cited

U.S. PATENT DOCUMENTS

| Re. 27,804 | 10/1973 | Treadway . | |
|---|---|---|---|
| 3,641,362 | 2/1972 | Gamble | 307/456 |
| 4,131,808 | 12/1978 | Kuo | 307/300 X |
| 4,132,906 | 1/1979 | Allen | 307/443 |
| 4,321,490 | 3/1982 | Bechdolt | 307/443 X |
| 4,330,723 | 5/1982 | Griffith | 307/443 X |
| 4,339,675 | 7/1982 | Ramsey | 307/456 X |
| 4,449,063 | 5/1984 | Ohmichi et al. | 307/456 |

FOREIGN PATENT DOCUMENTS

| 0097725 | 6/1982 | Japan | 307/456 |
|---|---|---|---|
| 0019032 | 2/1983 | Japan | 307/456 |

OTHER PUBLICATIONS

Signetics TTL Logic Data Manual 1982, pp. 2-1 and 2-2.

*Primary Examiner*—Stanley D. Miller
*Assistant Examiner*—D. R. Hudspeth
*Attorney, Agent, or Firm*—R. J. Meetin; R. T. Mayer; T. A. Briody

[57] ABSTRACT

A bipolar gate has an output transistor (Q5) that switches in response to the voltage at an emitter of a drive transistor (Q2 or Q10). An active pull-off circuit (14) discharges the base of the output transistor (Q5) when it turns off. The discharge path is provided through a pull-off transistor (Q7) whose collector is coupled to the base of the output transistor. The switching of the pull-off transistor is regulated with a control circuit containing a trigger circuit and a bias circuit. The trigger circuit is coupled between the bias circuit and a collector of the drive transistor. A "kicker" circuit formed with an input transistor (QC1) and a voltage reference (18) speeds up the switching of the drive transistor.

7 Claims, 7 Drawing Figures

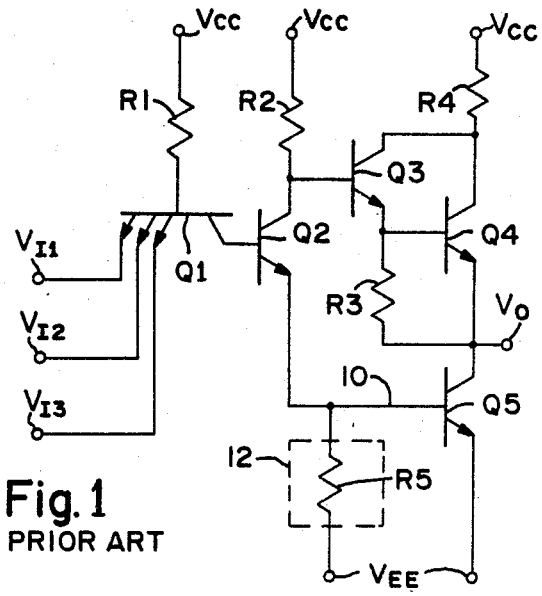
Fig. 1 PRIOR ART
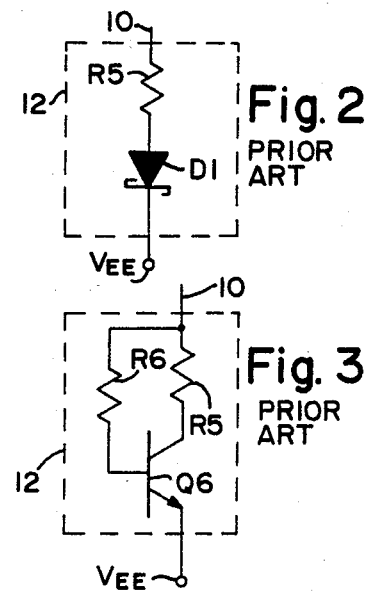
Fig. 2 PRIOR ART
Fig. 3 PRIOR ART
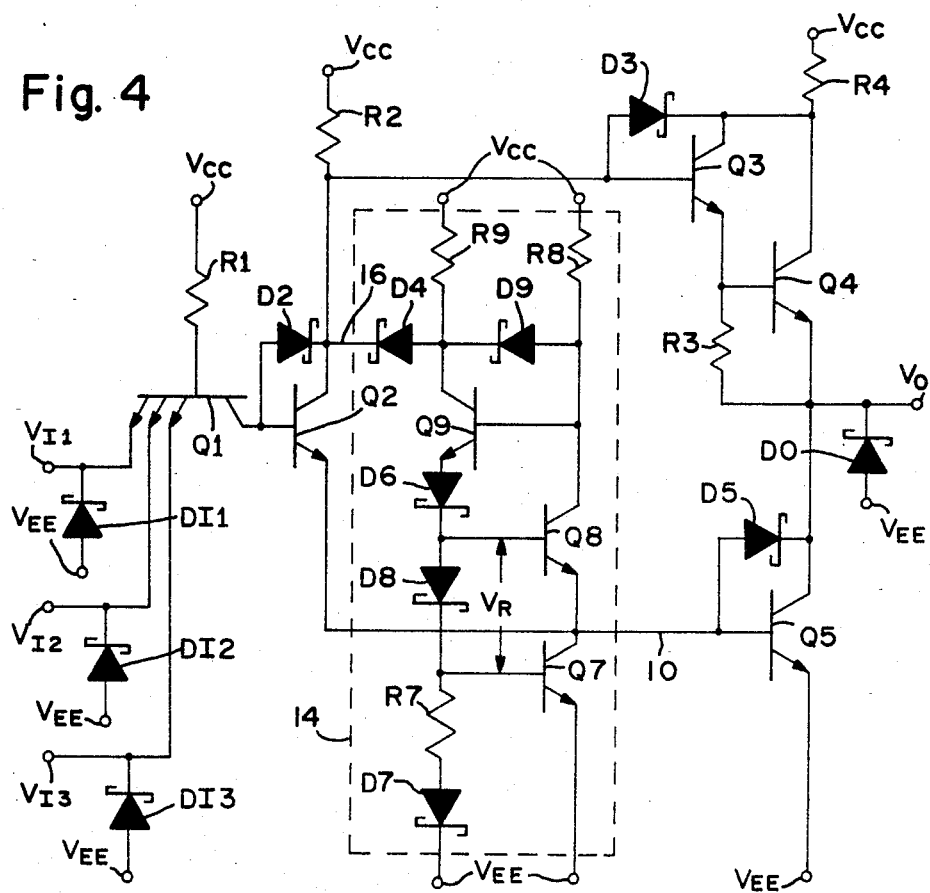
Fig. 4

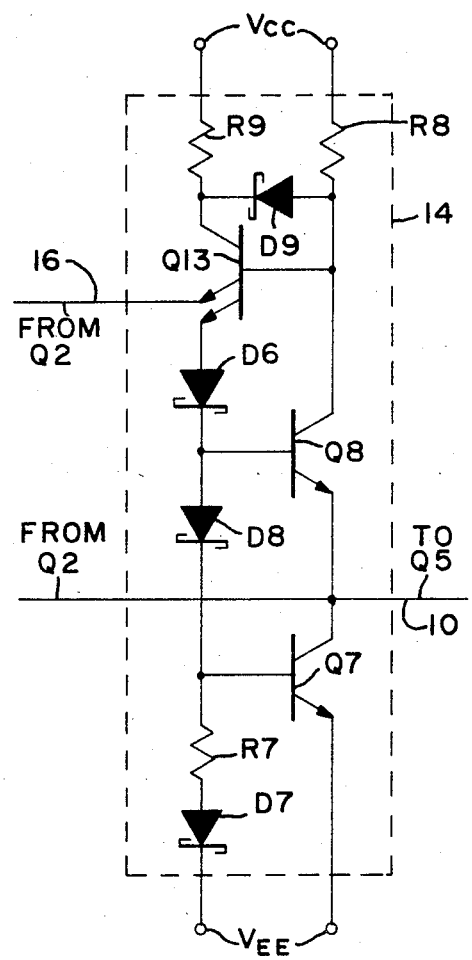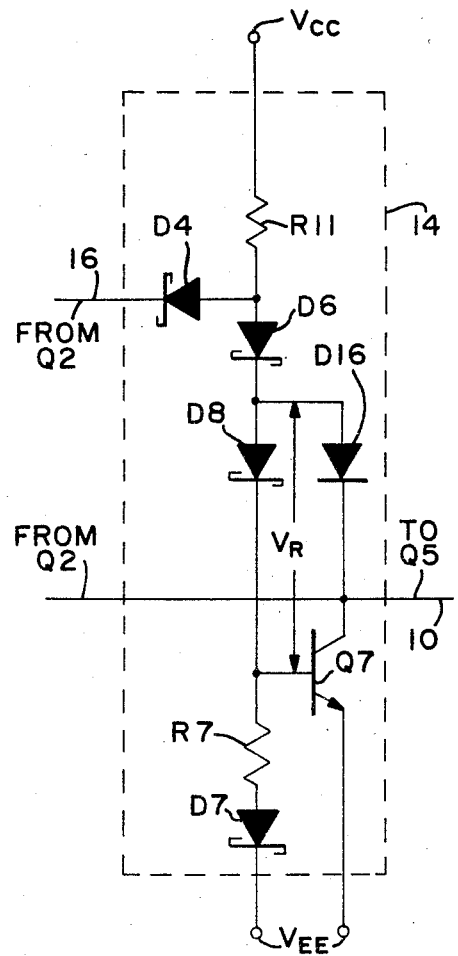

SWITCHING CIRCUIT WITH ACTIVE PULL-OFF

FIELD OF USE

This invention relates to switching circuits suitable for semiconductor devices and more particularly to bipolar digital gates using logic such as transistor-transistor logic (TTL).

BACKGROUND ART

TTL circuits are derived from a common NAND logic structure of which FIG. 1 shows a conventional arrangement. In this TTL gate, a set of logical input voltage signals represented here by input voltages $V_{I1}$, $V_{I2}$, and $V_{I3}$ are provided to the corresponding emitters of a multiple-emitter NPN input transistor Q1. Its collector is connected to the base of an NPN phase-splitting drive transistor Q2 in a switching section of the gate.

The connection of the Q1 collector to the Q2 base was originally the distinguishing feature of TTL circuitry. More recently, the definition of TTL has loosened somewhat. TTL today generally means a family of bipolar devices having certain input/output characteristics. The internal circuitry of current TTL gates may contain some circuitry that would strictly fall in another logic family such as diode transistor logic, integrated injection logic, and the like. Even the Q1 collector-Q2 base connection may be absent as long as the necessary input/output conditions are satisfied within the general realm of TTL design.

Returning to FIG. 1, the Q1 base is connected to a current source consisting of a resistor R1 connected to a source of a high supply voltage $V_{CC}$. The Q2 collector is connected to a current source formed by a resistor R2 tied to the $V_{CC}$ supply. The Q2 collector is further connected to the base of an NPN level-shifting transistor Q3. Its emitter drives an NPN output pull-up transistor Q4 and is also coupled through a resistor R3 to the Q4 emitter. The interconnected collectors of the Darlington pair Q3 and Q4 are connected to a current source consisting of a resistor R4 tied to the $V_{CC}$ supply.

The Q2 emitter is connected by way of a line 10 to the base of an NPN output pull-down transistor Q5 whose emitter is connected to a source of a low supply voltage $V_{EE}$. A logical output voltage signal $V_O$ is provided from the interconnection of the Q5 collector and the Q4 emitter. A passive output pull-down circuit 12 consisting here of a resistor R5 is connected between the $V_{EE}$ supply and the Q5 base by way of line 10.

The operation of this TTL gate can be understood by first assuming that each of digital inputs $V_{I1}$–$V_{I3}$ is at a high value or logical "1" (hereafter usually just "1") above the input switching point. Transistor Q1 has its base-collector junction conductively forward biased. This enables the R1 current source to provide current through the Q1 base-collector junction to the base of drive transistor Q2 so as to make it conductive. The R2 current source provides current through transistor Q2 to the base of transistor Q5 which is likewise turned on. Transistors Q3 and Q4 are turned off because the Q2 collector is at a low voltage. Output voltage $V_O$ is at a low value or logical "0" (hereafter usually just "0").

At least one of voltages $V_{I1}$–$V_{I3}$ is now dropped to a "0" below the input switching point so as to conductively forward bias the corresponding Q1 base-emitter junctions(s). This causes transistor Q2 to turn off which, in turn, causes transistor Q5 to turn off. The Q2 collector goes to a high voltage, causing transistor Q3 to turn on. Transistor Q4 then turns on and actively pulls voltage $V_O$ up to a "1". The reverse occurs when all of input voltages $V_{I1}$–$V_{I3}$ at "0" are raised to "1". The R1 source again provides current to the base of transistor Q2, enabling it to turn on. Its collector voltage goes low, forcing transistors Q3 and Q4 to turn back off. The turning on of transistor Q2 causes transistor Q5 to turn on and actively pull digital output $V_O$ down to "0".

In this type of TTL gate, pull-down circuit 12 provides a discharge path between the Q5 base and the $V_{EE}$ supply for removing the charge existing in the Q5 base when output $V_O$ goes high. This turns output transistor Q5 off faster so as to decrease the low-to-high output switching time. FIG. 1 illustrates perhaps the simplest such discharge path in the form of resistor R5. The difficulty with resistor R5 is that it draws a substantial amount of current from the $V_{CC}$ supply when output $V_O$ is low. Typically, resistor R5 draws about one third to one half of the current from the R2 source, the remainder of the R2 current going to transistor Q5. In turn, the R2 current is typically 80%–90% of the total current $I_{CCL}$ provided from the $V_{CC}$ supply when output $V_O$ is low. Inasmuch as $I_{CCL}$ is normally much greater than the total current $I_{CCH}$ provided from the $V_{CC}$ supply when output $V_O$ is high, the R5 current is a significant drain on an integrated circuit containing the gate of FIG. 1.

FIG. 2 shows another version of pull-down circuit 12 employable in the gate of FIG. 1. In FIG. 2, a Schottky diode D1 is connected between resistor R5 and the $V_{EE}$ supply. When transistor Q5 is turned on, diode D1 is forwardly conductive and transmits current from the R2 source to the $V_{EE}$ supply. This occurs because the Q5 $V_{BE}$ is greater than the voltage of about a $V_{SH}$ across diode D1. $V_{BE}$ is the base-to-emitter voltage for a bipolar transistor when its base-emitter junction is just conductively forward biased. $V_{SH}$, which is about 0.25 volt less than a standard $V_{BE}$ for an NPN transistor, is the standard Schottky diode-drop voltage for a Schottky diode when it is just conductively forward biased. When transistor Q5 turns off, diode D1 remains on to discharge the base of transistor Q5 until its base-to-emitter voltage drops just below $1V_{SH}$. Diode D1 then turns off so as to effectively prevent the Q5 base from dropping further. The Q5 base only has to rise slightly more than the difference between the Q5 $V_{BE}$ and $1V_{SH}$ when transistor Q5 turns back on. This decreases the high-to-low output switching time compared to FIG. 1 in which the Q5 base travels the full Q5 $V_{BE}$. However, the $I_{CCL}$ of circuit 12 of FIG. 2 is approximately equal to the high value of FIG. 1. This is again disadvantageous.

FIG. 3 illustrates another version of pull-down circuit 12 suitable for the gate of FIG. 1. In circuit 12 of FIG. 3 as disclosed in U.S. Pat. No. RE 27,804, an NPN transistor Q6 is collector-emitter connected between resistor R5 and the $V_{EE}$ supply. The Q6 base is coupled through a resistor R6 to the Q5 base. The effective $V_{BE}$ of transistor Q6 is less than that of output transistor Q5. As a result, transistor Q6 turns off in response to transistor Q5 turning off and vice versa. Just before transistor Q6 turns off, it provides a path to the $V_{EE}$ supply for discharging the Q5 base. Transistor Q6 subsequently allows the base of transistor Q5 to drop only slightly below its turn-on point. This further decreases the highto-low output switching time. However, an undesirable ripple in output $V_O$ may occur just as transistor Q5 turns off. Moreover, circuit 12 of FIG. 3 has the same disadvantage as circuits 12 of FIGS. 1 and 2 in that it draws an undesirably high amount of current from the $V_{CC}$ supply when voltage $V_O$ is low.

DISCLOSURE OF THE INVENTION

In accordance with the invention, a gate having a bipolar output transistor which turns on and off as a switching section in the gate changes state contains an active pull-off circuit for discharging the base of the output transistor when it turns off. As used here, "discharging" means to neutralize the charge stored in the base of the output transistor. This may involve providing charge to or removing charge from the base depending on the polarity of the output transistor.

More particularly, the switching section normally contains a like-polarity bipolar drive transistor which turns on and off in response to one or more input signals supplied to the switching section. The drive transistor has a collector coupled to a first voltage supply. The output transistor has an emitter coupled to a second voltage supply. The output transistor responds through its base to the voltage at the emitter of the drive transistor in such a manner as to turn on in response to the drive transistor turning on and to turn off in response to the drive transistor turning off.

The pull-off circuit contains a like-polarity bipolar pull-off transistor. It has an emitter coupled to the second voltage supply and a collector coupled to the base of the output transistor. The pull-off transistor thus provides the requisite path to the second voltage supply for discharging the base of the output transistor when it turns off.

A control circuit in the pull-off circuit causes the pull-off transistor to turn off in response to the turning on of the drive transistor. In this way, no current from the first voltage supply is transmitted through the pull-off transistor to the second voltage supply when the output transistor is turned on. The control circuit itself utilizes very little current when the output transistor is turned on. Accordingly, the current provided from the first voltage supply to the present gate when the output transistor is turned on is typically reduced about one third compared to the $I_{CCL}$ of the above prior art TTL gates.

The control circuit provides a sufficient bias current to the base of the pull-off transistor to cause it to turn on in response to the turning off of the drive transistor. The control circuit then responds to the voltage at the collector of the pull-off transistor to force the output transistor to turn off. During the subsequent period when the output transistor is turned off, the control circuit does draw some current. This slightly increases the current requirements on the first voltage supply compared to the $I_{CCH}$ levels of the above prior art gates but is less than their $I_{CCL}$ levels. In short, the active pull-off circuit in the present gate trades off a large decrease in the current needed during periods of maximum usage against a slight increase in the current needed during periods of minimum usage so as to decrease both the overall and peak strain on the first voltage supply.

The control circuit preferably contains a sensing circuit, a voltage reference element, a bias circuit, and a trigger circuit. The voltage reference element, optimally a diode, is coupled between the sensing circuit and the base of the pull-off transistor. The sensing circuit determines the voltage at the collector of the pull-off transistor. This is optimally accomplished with a like-polarity bipolar sensing transistor matched to the pull-off transistor and emitter-base coupled between its collector and the reference element. As a result, the base-to-emitter voltage of the output transistor when it is non-conductive equals the voltage across the reference element. The value of this reference voltage can be chosen so as to optimize performance.

The trigger circuit triggers the bias circuit in response to the turning off of the drive transistor. The bias circuit then provides the bias current through the voltage reference element to the base of the pull-off transistor at the level necessary for turning on the pull-off transistor. Internal feedback in the control circuit enables the sensing and pull-off transistors to stabilize in their active regions and draw relatively little current.

BRIEF DESCRIPTION OF THE DRAWINGS

FIG. 1 is a circuit diagram of a conventional TTL NAND gate utilizing an output pull-down circuit consisting of a resistor.

FIGS. 2 and 3 are other versions of prior art pull-down circuits employable in the TTL gate of FIG. 1.

FIG. 4 is a circuit diagram of an embodiment of a TTL NAND gate containing an active output pull-off circuit in accordance with the invention.

FIGS. 6 and 7 are circuit diagrams of further embodiments of active output pull-off circuits employable in accordance with the invention in the gate of FIG. 4.

Like reference symbols are employed in the drawings and in the description of the preferred embodiments to represent the same or very similar item or items.

DESCRIPTION OF THE PREFERRED EMBODIMENTS

Figure 5:
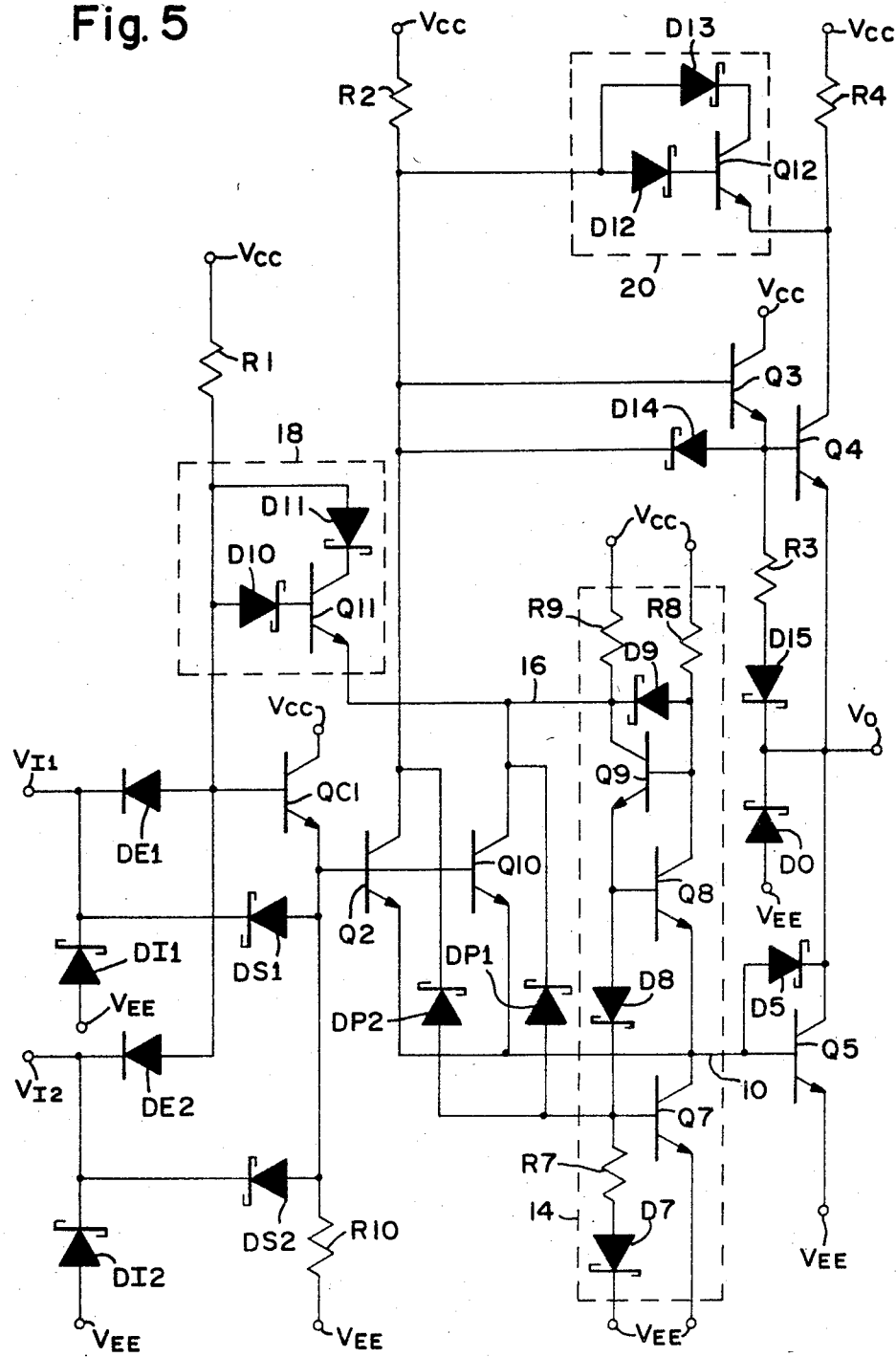
FIG. 5 is a circuit diagram of an embodiment of another NAND gate having an active output pull-off circuit in accordance with the invention.

Referring to the drawings, FIG. 4 shows a TTL NAND gate having an active pull-off circuit 14 for discharging the base of NPN output transistor Q5 to the $V_{EE}$ supply when NPN phase-splitting drive transistor Q2 turns off so as to help turn off transistor Q5. Pull-off circuit 14 also diverts the Q2 collector-to-emitter current away from the Q5 base to the $V_{EE}$ supply as transistor Q2 is turning off. This further helps turn off transistor Q5.

In addition to transistors Q2 and Q5, this NAND gate contains NPN transistors Q1, Q3, and Q4 and resistors R1, R2, R3, and R4 configured the same as in FIG. 1 and operable in largely the same manner. The gate of FIG. 4 also contains Schottky diodes DI1, DI2, and DI3 which respectively prevent input voltages VI1, VI2, and VI3 from dropping more than $1V_{SH}$ below $V_{EE}$. A Schottky diode DO likewise prevents output voltage VO from dropping more than $1V_{SH}$ below $V_{EE}$. Schottky diodes D2, D3, and D5 respectively clamp transistors Q2, Q3, and Q5 out of deep saturation. A Schottky diode (not shown) may be anode-to-cathode connected between the base of transistor Q1 and its collector to clamp it out of deep saturation.

Pull-off circuit 14 consists of an NPN pull-off transistor Q7 and a control circuit connected to the base and collector of transistor Q7 to regulate its operation so as to enable it to provide the requisite discharge path from the Q2 emitter and the Q5 base to the $V_{EE}$ supply. Transistor Q7 has its emitter tied to the $V_{EE}$ supply and its collector connected by way of line 10 to the Q2 emitter and the Q5 base. The control circuit turns on transistor Q7 to open the discharge path in response to the turning off of drive transistor Q2. When transistor Q2 turns back on, the control circuit responds by turning off transistor Q7 to close the discharge path.

The control circuit contains a circuit for discharging the base of pull-off transistor Q7 as it turns off. This discharge circuit preferably consists of a resistor R7 and an optional Schottky diode D7 connected in series between the Q7 base and the $V_{EE}$ supply as in FIG. 2. The discharge circuit operates in the same manner as pull-down circuit 12 of FIG. 2 but draws much less current.

The control circuit has an NPN sensing transistor Q8 whose emitter is connected to the Q7 collector. The diode defined by the Q8 base-emitter junction senses the Q7 collector voltage. This provides feedback to the control circuit to enable it to keep transistor Q7 turned on when transistor Q2 is turned off. Transistors Q7 and Q8 are matched to each other. "Matched" here means geometrically the same (except for items such as collector areas which do not materially affect the pertinent operation), oriented in the same direction, and subjected to substantially the same temperature variation (normally because of close proximity).

A voltage reference element is connected between the Q7 and Q8 bases so that there is a reference voltage (drop) $V_R$ from the Q8 base to the Q7 base when transistors Q7 and Q8 are simultaneously conductive. $V_R$ is less than the Q5 $V_{BE}$. This condition is met in FIG. 5 where the reference element is a Schottky diode D8 oriented forwardly in series with the Q7 base-emitter junction. $V_R$ thereby equals $1V_{SH}$. When transistors Q7 and Q8 are both turned on so that transistor Q5 is turned off, the Q5 base-to-emitter voltage equals the Q7 $V_{BE}$ plus $V_R$ minus the Q8 $V_{BE}$. Since transistors Q7 and Q8 are matched, their $V_{BE}$'s are nearly the same. Accordingly, the Q5 base-to-emitter voltage equals $V_R$, assuring that transistor Q5 is indeed off.

Transistor Q5 is typically a large transistor with the smallest $V_{BE}$ in the circuit. That is, the Q5 $V_{BE}$ is slightly less than a standard NPN $V_{BE}$. In view of this, the voltage reference element could alternatively be a relatively large diode-connected NPN transistor whose $V_{BE}$ is small because nearly all the current goes through the collector in contrast to the base.

A bias circuit in the control circuit provides a bias current through diode D8 to the base of transistor Q7 when it is turned on. The bias circuit contains an NPN bias-control transistor Q9 whose emitter is coupled in common to the D8 anode and the Q8 base. Transistor Q9 has its base connected to the Q8 collector and also to a current source consisting of a resistor R8 connected to the $V_{CC}$ supply. The Q9 collector is connected to another current source formed by a bias resistor R9 tied to the $V_{CC}$ supply. A Schottky diode D9 is cathode-to-anode connected between the collector and base of transistor Q9 so as to clamp it out of deep saturation.

A trigger circuit "triggers" the bias circuit to enable it to provide the bias signal at a voltage sufficient to turn on transistor Q7 in response to transistor Q2 turning off. When transistor Q2 turns back on, the trigger circuit "detriggers" the bias circuit so that it cuts the bias voltage down to a level adequate to turn transistor Q7 back off. The principal element of the trigger circuit is a Schottky diode D4 whose anode is connected to the Q9 collector and whose cathode is connected by way of a line 16 to the Q2 collector. Diode D4 also serves as an isolation element to prevent pull-off circuit 14 from loading the R2 source when transistor Q2 is turned off. Another Schottky diode D6 anode-to-cathode connected between the Q9 emitter and the D8 anode acts as a level shifter to compensate for the voltage drop across diode D4.

Pull-off circuit 14 operates in the following manner. Assume that transistors Q2 and Q5 are initially turned on as the result of inputs $V_{I1}$-$V_{I3}$ all being high at logical "1". There is a current path from the R1 source to the Q2 base by way of the Q1 base-collector junction which is conductive. (If transistor Q1 is Schottky clamped, the current path is through the clamping diode which is turned on.) With transistors Q3 and Q4 turned off, output $V_O$ is low at logical "0". Transistors Q7 and Q8 are turned off. Diodes D4 and D9 are conductive so as to establish a path for transmitting current from the R8 and R9 current sources through transistor Q2 to the Q5 base. This current is in addition to that provided from the R2 source. Diodes D6, D7, and D8 and the Q9 base-emitter junction are non-conductive.

One or more of inputs $V_{I1}$-$V_{I3}$ is now brought low to "0", causing transistor Q2 to start to turn off. Its collector voltage rises. This allows the Q9 collector and base voltages to rise. A point is rapidly reached at which diodes D6, D7, and D8 and the Q9 base-emitter junction become conductive. This slows down the rate at which the Q9 collector voltage rises. As a result, diode D4 turns off to close the current path from the R9 and R8 sources to the Q2 collector and complete the triggering of the bias circuit.

The R9 source now provides bias current through transistor Q9 and diodes D6 and D8 to the base of pull-off transistor Q7, enabling it to turn on. Diode D9 may stay on or may turn off depending on various parameters such as the values of resistors R8 and R9. As drive transistor Q2 continues to turn off, the R2 current still going through transistor Q2 is transmitted through transistor Q7 to the $V_{EE}$ supply so as to enhance removal of the base drive for output transistor Q5. Likewise, the charge in the Q5 base discharges through transistor Q7 to the $V_{EE}$ supply. Transistors Q3 and Q4 turn on to pull output $V_O$ up to "1".

As transistor Q7 turns on, its collector voltage drops. This drop is sensed by the emitter of transistor Q8 which turns on as soon as the voltage drop is great enough to conductively forward bias the Q8 base-emitter junction. Transistor Q8 draws current from the R8 source, causing the voltage drop across resistor R8 to increase. This reduces the Q9 base voltage. Transistor Q9 then becomes slightly less conductive and transmits slightly less current from the R9 source to the Q7 base. In turn, the collector voltage of transistor Q7 rises slightly as it becomes less conductive. Transistor Q8 senses the increase in the Q7 collector voltage and also starts to become slightly less conductive. This causes a smaller change in the voltage drop across resistor R8. The sequence just described then repeats itself with smaller voltage changes until transistors Q7, Q8, and Q9 finally stabilize in their active regions. At this point, the voltage across the Q5 base-emitter junction equals $V_R$.

Next, all of inputs $V_{I1}$-$V_{I3}$ not at "1" are raised to "1", enabling transistor Q2 to turn back on. Its collector voltage drops until diode D4 in the trigger circuit becomes conductive. The R9 current previously going through transistor Q9 is diverted through diode D4 and transistor Q2 to the Q5 base. The R9 current also increases, causing the Q9 collector voltage to drop. If not already on, diode D9 turns on to bring the Q9 base voltage down. A point is rapidly reached at which diodes D6, D7, and D8 and the Q9 base-emitter junction become non-conductive. This completes the detriggering of the bias circuit. It no longer provides bias current from the R9 source to the bases of transistors Q7 and Q8. Both of them turn off. The charge in the Q7 base discharges to the $V_{EE}$ supply through resistor R7 and diode D7. In combination with diode D8, they also provide a discharge path for the charge in the Q8 base. Transistors Q3 and Q4 turn off. With the base drive for transistor Q5 restored, it turns on to pull output $V_O$ back down to "0".

Turning to FIG. 5, it illustrates a (TTL-type) NAND gate containing another version of pull-off circuit 14. This gate contains many elements configured the same and operable in substantially the same manner as elements labelled with the same reference symbols in FIG. 4. Insofar as this is true, these elements in FIG. 5 are largely not discussed.

In FIG. 5, the combination of PN-junction input diodes DE1 and DE2 and the base-emitter junction of an NPN input transistor QC1 replaces transistor Q1. Transistor QC1 has its collector tied to the $V_{CC}$ supply to prevent it from saturating. The QC1 emitter is coupled through a resistor R10 to the $V_{EE}$ supply; as a result, transistor QC1 is turned on whenever any of inputs $V_{I1}$ and $V_{I2}$ is above $V_{EE}$. In addition to driving the base of drive transistor Q2 which is the regular phase-splitter for the gate of FIG. 5, the QC1 emitter drives the base of another NPN phase-splitting drive transistor Q10 whose emitter is connected in common with the Q2 emitter to the Q5 base. The Q2 and Q10 bases are further connected to the anodes of Schottky diodes DS1 and DS2 whose cathodes respectively receive voltages $V_{I1}$ and $V_{I2}$. Diodes DS1 and DS2 in combination with resistor R10 facilitate the turning off of transistors Q2 and Q10 by drawing off charge from their bases during turn-off.

Transistors QC1 and Q10 and a voltage reference 18 form a "kicker" circuit that speeds up the switching of transistors Q10 and Q2. The primary elements of reference 18 are an NPN reference transistor Q11 and a Schottky diode D10 whose cathode is connected to the Q11 base. The Q11 emitter is connected to the Q10 collector. The Q11 collector is coupled through a Schottky diode D11 to both the D10 anode and the QC1 base. Diode D11 prevents transistor Q11 from transmitting current in the opposite direction from normal.

The kicker circuit works as follows, starting with at least one of inputs $V_{I1}$ and $V_{I2}$ at "0" and with diode D10 and transistor Q11 turned off. When the last input VI1 or $V_{I2}$ at "0" starts rising toward "1", transistor QC1 rapidly provides a large amount of current to transistors Q2 and Q10 to turn them on very quickly. This occurs because only transistor QC1 lies in the current path between the $V_{CC}$ supply and the Q2 and Q10 bases. The Q10 collector voltage drops, enabling diode D10 and transistor Q11 to turn on. The reference voltage existing between the D10 anode and the Q11 emitter is then imposed across the series combination of the QC1 base-emitter junction and the Q10 base-collector junction so as to prevent the Q10 collector from dropping much further. This clamps transistors Q2 and Q10 out of deep saturation. As a result, they turn off very quickly when input $V_{I1}$ or $V_{I2}$ goes low.

In FIG. 5, the Q2 collector is not operably connected to the R9 source, whereas the Q10 collector is connected by way of line 16 to the R9 source but is not connected to the R2 source. This arrangement provides the necessary isolation to prevent pull-off circuit 14 from loading the R2 source when transistors Q2 and Q10 are turned off. Accordingly, diode D4 and compensating diode D6 are absent in circuit 14 of FIG. 5 since there is no need for them.

A Schottky diode DP1 is cathode-to-anode connected between the Q10 collector and the Q7 base. Another Schottky diode DP2 is similarly connected between the Q2 collector and the Q7 base. Diodes DP1 and DP2 enhance the turning on of transistor Q7 by capacitively coupling charge to the Q7 base from the collectors of transistors Q10 and Q2 as they turn off. This more quickly opens the discharge path through transistor Q7 to the $V_{EE}$ supply when transistors Q2 and Q10 turn off so as to enable transistor Q5 to turn off faster.

The Q3 collector in FIG. 5 is tied directly to the $V_{CC}$ supply so that transistor Q3 cannot saturate. A voltage reference 20 acts as a sensing element to prevent transistor Q4 from going into deep saturation. In reference 20 which is configured the same as reference 18, a Schottky diode D12 is anode-to-cathode connected between the Q3 base and the base of a transistor Q12 whose emitter is connected to the Q4 collector. The Q12 collector is coupled to the D12 anode through a Schottky diode D13 which prevents transistor Q12 from transmitting current in the reverse direction. Transistors Q3 and Q12 are both turned on at the same time so that their $V_{BE}$'s approximately cancel. Accordingly, reference 20 effectively acts as a Schottky clamp on transistor Q4.

This gate also contains Schottky diodes D14 and D15 connected as shown in FIG. 5. Diode D14 is used to remove charge from transistor Q4. Diode D15 allows output $V_O$ to settle at a voltage below the base voltage of transistor Q4 when it is turned off.

In FIG. 5, supplies $V_{CC}$ and $V_{EE}$ are preferably 5.0 volts and 0 volts, respectively. The switching point for inputs $V_{I1}$ and $V_{I2}$ is $2V_{BE}$, while their nominal "0" and "1" levels are less than 0.8 volt and more than 2.0 volts, respectively. The nominal "0" and "1" levels for output $V_O$ are less than 0.55 volt and more than 2.0 volts, respectively. A standard $V_{BE}$ is about 0.75 volt. $V_{SH}$ is about 0.5 volt. Resistors R1, R2, R3, R4, R7, R8, R9, and R10 are preferably 10,000 ohms, 1,200 ohms, 290 ohms, 25 ohms, 1,500 ohms, 10,000 ohms, 1,200 ohms, and 15,000 ohms, respectively.

The gate of FIG. 5 operates largely the same as the gate of FIG. 4. Again assume that voltages $V_{I1}$ and $V_{I2}$ are initially at "1". Voltage $V_O$ is at "0". Diodes D7, D8, DE1, VE2, DP1, DP2, D12 and D13 are non-conductive as are transistors Q7, Q8, Q9, Q3, Q4, and Q12. Transistors QC1, Q2, Q10, Q11, and Q5 are conductive along with diodes D10, D11, D9, and D5. At least one of inputs $V_{I1}$ and $V_{I2}$—e.g., input $V_{I1}$—*is dropped to* "0". Diode DE1 turns on, causing transistors QC1, Q2, Q10, and Q11 to turn off. This also causes diodes D9, D10, and D11 to turn off. The turning off of diode D9 triggers the bias circuit in circuit 14. The R9 source then provides bias current through transistor Q9 and diode D8 to the base of pull-off transistor Q7 which turns on. This opens the discharge path from the Q2 and Q10 emitters and the Q5 base through transistor Q7 to the $V_{EE}$ supply so as to enable output transistor Q5 to turn off. Diode D5 also turns off. Transistor Q8 turns on and senses the Q7 collector voltage so as to force transistors Q7, Q8, and Q9 to settle in their active regions according to the feedback mechanism described above for FIG. 4. Transistors Q3, Q4, and Q12 turn on along with diodes D12 and D13 as voltage $V_O$ goes to "1".

Basically the reverse occurs when voltage $V_{I1}$ is returned to "1". Diode DE1 turns back off, causing transistors QC1, Q2, Q10, and Q11 to turn back on along with diodes D9, D10, and D11. The turning on of transistor Q10 reduces the Q9 collector voltage and diverts current from the R9 source away from transistor Q9 to transistor Q10. This detriggers the bias circuit so as to cut off the bias current to the base of the transistors Q7 and Q8 which turn off. Resistor R7 and diode D7 provide the discharge path for the Q7 base. Transistor Q5 turns back on to pull voltage $V_O$ down to "0". Diode D5 turns on shortly thereafter to clamp transistor Q5 out of deep saturation. Transistors Q3, Q4, and Q12 turn off as do diodes D12 and D13.

FIG. 6 depicts another version of pull-off circuit 14 employable in the gate of FIG. 4. Circuit 14 in FIG. 6 contains all the elements of circuit 14 of FIG. 4 except that elements Q9 and D4 in FIG. 4 are replaced with a double-emitter NPN transistor Q13 in FIG. 6. One of the Q13 emitters is coupled through diodes D6 and D8 to the Q7 base, while the second Q13 emitter is connected directly by way of line 16 to the Q2 collector. The second Q13 emitter provides the necessary isolation for preventing pull-off circuit 14 from loading the R2 source when transistor Q2 is turned off. Aside from this difference, circuit 14 of FIG. 6 functions in virtually the same manner as that of FIG. 4.

FIG. 7 illustrates yet another version of pull-off circuit 14 employable in FIG. 4. Circuit 14 in FIG. 7 contains elements Q7, R7, D7, and D8 interconnected as described above. In place of transistor Q8 is a sensing PN-junction diode D16 whose anode is connected to the D8 anode and whose cathode is connected to the Q7 collector. Diode 16 is matched to the Q7 base-emitter junction. As a result, the base-to-emitter voltage of transistor Q5 when it is turned off again equals $V_R$. A bias circuit consisting of a bias resistor R11 tied to the $V_{CC}$ supply provides the necessary bias current through diode D8 to the base of transistor Q7 when it is turned on. Isolation diode D4 is coupled between the Q2 collector and the D6 anode to again prevent loading of the R2 source when transistor Q2 is turned off. Diode D6 is connected between the D4 and D8 anodes to compensate for the voltage across diode D4. Circuit 14 in FIG. 7 operates largely the same as circuit 14 in FIG. 4 or 6. Diode D16 performs the sensing function done by transistor Q8, particularly its base-emitter junction. While circuit 14 of FIG. 7 is simpler than those of FIGS. 4 and 6, its response is slower. As in FIG. 5, second phase-splitter Q10 could be used in place of diodes D4 and D6 to isolate the R2 source from circuit 14 when transistor Q2 is off.

Methods for manufacturing the various elements of the present gates are well known in the semiconductor art. These gates are preferably manufactured in monolithic integrated circuit form according to conventional planar processing techniques using oxide (or PN-junction) isolation to separate active regions on a semiconductor wafer. The Schottky diodes are likewise formed according to standard Schottky processing techniques.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results except that many of the Schottky diodes would be deleted, formed in separate active semiconductor regions, or replaced with PN-junction diodes. The drive transistor (Q2) might be replaced with a transistor of opposite polarity to the pull-off transistor; their collectors would then be coupled together. Thus, various modifications, changes, and applications may be made by those skilled in the art without departing from the true scope and spirit of the invention as defined by the appended claims.

What is claimed is:

1. A gate in which: a bipolar drive transistor has an emitter, a base, and a collector coupled to a first voltage supply; a like-polarity bipolar output transistor which turns on in response to the drive transistor turning on and turns off in response to the drive transistor turning off has an emitter coupled to a second voltage supply, a base responsive to the voltage level at the emitter of the drive transistor, and a collector; a like-polarity bipolar pull-off transistor has an emitter coupled to the second supply, a base, and a collector coupled to the base of the output transistor; and control means turns off the pull-off transistor in response to the drive transistor turning on, turns on the pull-off transistor in response to the drive transistor turning off so as to help turn off the output transistor, and then keeps the pull-off transistor turned on in response to the voltage level at the collector of the pull-off transistor; characterized by:

a like-polarity bipolar input transistor having an emitter coupled to the base of the drive transistor, a base, and a collector coupled to the first supply; and a voltage reference coupled between the collector of the drive transistor and the base of the input transistor.

2. A gate as in claim 1 characterized in that the reference comprises:

a like polarity bipolar reference transistor having an emitter coupled to the collector of the drive transistor, a base, and a collector coupled to the base of the input transistor; and a diode coupled forwardly in series with the base-emitter junction of the reference transistor between its collector and base.

3. A gate as in claim 2 characterized in that the diode is a Schottky diode.

4. A gate in which: a bipolar drive transistor has an emitter, a base, and a collector coupled to a first voltage supply; a like-polarity bipolar output transistor which turns on in response to the drive transistor turning on and turns off in response to the drive transistor turning off has an emitter coupled to a second voltage supply, a base responsive to the voltage level at the emitter of the drive transistor, and a collector; a like-polarity bipolar pull-off transistor has an emitter coupled to the second supply, a base, and a collector coupled to the base of the output transistor; and control means turns off the pull-off transistor in response to the drive transistor turning on, turns on the pull-off transistor in response to the drive transistor turning off so as to help turn off the output transistor, and then keeps the pull-off transistor turned on in response to the voltage level at the collector of the pull-off transistor, the control means comprising sensing means for determining the voltage at the collector of the pull-off transistor, a voltage reference element coupled between the sensing means and the base of the pull-off transistor, bias means for providing a bias current through the voltage reference element to the base of the pull-off transistor, and trigger means for causing the bias means to provide the bias current at a sufficient voltage level to turn on the pull-off transistor in response to the drive transistor turning off; characterized in that the trigger means is coupled between the bias means and the collector of the drive transistor.

5. A gate as in claim 4 characterized in that the bias means comprises:

a like-polarity bipolar bias transistor having an emitter coupled to the voltage reference element, a base coupled to the sensing means, and a collector;

a resistor coupled between the first supply and the base of the bias transistor;

a resistor coupled between the first supply and the collector of the bias transistor; and a diode coupled between the base and collector of the bias transistor.

6. A gate as in claim 5 characterized in that the trigger means comprises a substantially direct connection of the collectors of the drive and bias transistors.

7. A gate as in claim 5 characterized in that the bias means comprises a diode coupled between the collectors of the drive and bias transistors, another diode coupled between the voltage reference element and the emitter of the bias transistor.

* * * * *